United States Patent
Dunand et al.

(10) Patent No.: US 7,473,851 B2
(45) Date of Patent: Jan. 6, 2009

(54) CROSS-CONNECTING BY PERMUTATIONS USING CONFIGURABLE PRINTED CIRCUITS

(75) Inventors: Michel Dunand, Balma (FR); Jean-Jacques Carrillo, Montauban (FR)

(73) Assignees: Labinal, Montigny le Bretonneux (FR); Airbus France, Toulouse (FR)

( * ) Notice: Subject to any disclaimer, the term of this patent is extended or adjusted under 35 U.S.C. 154(b) by 445 days.

(21) Appl. No.: 11/118,410

(22) Filed: May 2, 2005

(65) Prior Publication Data
US 2005/0241852 A1    Nov. 3, 2005

(30) Foreign Application Priority Data
May 3, 2004   (FR) ................... 04 04695

(51) Int. Cl.
*H05K 1/00*    (2006.01)
(52) U.S. Cl. .................... 174/254; 174/261
(58) Field of Classification Search ................ 174/254, 174/261; 361/792–795
See application file for complete search history.

(56) References Cited
U.S. PATENT DOCUMENTS

| | | | |
|---|---|---|---|
| 4,859,806 A * | 8/1989 | Smith ................ 174/261 |
| 4,889,961 A | 12/1989 | Carlson | |
| 5,442,170 A | 8/1995 | Kreft et al. | |
| 5,701,234 A | 12/1997 | Wong | |
| 5,999,097 A * | 12/1999 | Liddle et al. ............. 340/550 |
| 6,613,988 B2 * | 9/2003 | Powers .................. 174/261 |
| 6,916,996 B2 * | 7/2005 | Kuan et al. ............. 174/262 |

FOREIGN PATENT DOCUMENTS
WO    WO 00/25392    5/2000

* cited by examiner

*Primary Examiner*—Jeremy C Norris
(74) *Attorney, Agent, or Firm*—Oblon, Spivak, McClelland, Maier & Neustadt, P.C.

(57) ABSTRACT

The invention relates to wiring in a junction box using a printed circuit panel having on one of its edges N input terminals and on the opposite edge N output terminals, and between said two edges, a plurality of stages of individual connection devices each having two inputs and two outputs, the two inputs of a device being electrically connected to the two outputs of said device firstly by two direct connections and secondly by two crossed-over branch connections, the inputs of the devices of the first stage being electrically connected directly to input terminals, the outputs of the devices of the last stage being electrically connected directly to the output terminals, and between two successive stages, the outputs of each device of a lower stage are electrically connected to respective inputs of each device of the stage of higher rank. To personalize the wiring, either the direct connections or else the branch connections are interrupted in each of the devices.

16 Claims, 6 Drawing Sheets

CROSS-CONNECTING BY PERMUTATIONS USING CONFIGURABLE PRINTED CIRCUITS

The invention relates to a method of providing personalized one-to-one electrical wiring between N input wires entering a junction box and N output wires leaving it.

In the present description, this wiring operation is also referred to as "cross-connecting".

BACKGROUND OF THE INVENTION

Junction boxes are used for connecting the electrical harnesses as fitted in particular to airplanes, and for electrically configuring such airplanes without modifying existing electrical harasses, thus making it possible to obtain wiring that matches the requirements of customers.

Conventionally, in aviation, cable systems are used that make use of harnesses of electric wires. Harnesses are made up on demand as a function of customer requirements. They therefore differ from one airplane to another, depending on specific needs, and they contain a large number of branch connections. Cross-connections between different harnesses are thus established at disconnection terminals that are concentrated at the boundaries between airplane segments.

In order to simplify the fabrication of harnesses, it has been found to be preferable, in particular in the field of helicopters, to concentrate branch connections and cross-connections between terminals within junction boxes. These junction boxes can be made either by juxtaposing special small harnesses or else by the wire-wrapping technique. Wiring such junction boxes can then become very complex. Such wiring is heavy, bulky, expensive, and differs from one aircraft to another.

Recently, it has been found advantageous to use ribbon cables of wires instead of conventional harnesses of wires. This means that it is not possible to implement cross-connections within connectors, since the wires are ordered, and this also makes it difficult to establish branch connections.

OBJECT AND SUMMARY OF THE INVENTION

The object of the invention is to provide a method that makes it possible simply and at low cost to provide cross-connections and branch connections in a manner that is easily configured in junction boxes having N input wires and N output wires.

According to the invention, this object is achieved by the following steps:

making a printed circuit panel having N input terminals and N output terminals interconnected by a network of tracks and comprising a plurality of individual connection devices each connecting two adjacent inputs taken from two of the tracks to two adjacent outputs taken from the same two tracks, so that said two inputs are electrically connected to said two outputs, firstly by two direct connections constituted by portions of said tracks, and secondly by two crossed-over branch connections, such that each input terminal is electrically connected to all of the output terminals, and each output terminal is electrically connected to all of the input terminals;

personalizing said panel by interrupting in each individual connection device either its direct connections or its branch connections so as to obtain personalized one-to-one electrical wiring between the N input terminals and the N output terminals of said panel, the number and the disposition of said devices being selected in such a manner as to make all possible wiring combinations possible; and mounting the personalized panel in a junction box.

Instead of using traditional cross-connections, the cross-connection method of the invention makes it possible to implement interconnection functions using a printed circuit that is configurable by using individual connection devices, each making it possible for two tracks to be permutated (swapped over) electrically.

The invention also provides a printed circuit panel for implementing the method.

The printed circuit panel comprises N input terminals and N output terminals, the input terminals and the output terminals being interconnected by a network of tracks, the tracks being interconnected by a plurality of individual two input and two output connection devices disposed between adjacent portions of two tracks, the two inputs of one device being electrically connected to the two outputs of said device firstly by two direct connections constituted by said track portions, and secondly by two crossed-over branch connections, such that each input terminal is electrically connected to all of the output terminals and each output terminal is electrically connected to all of the input terminals, the number and the disposition of said devices being selected in such a manner as to enable all possible wiring combinations to be implemented by interrupting in each individual connection device either the direct connections or the branch connections.

Advantageously, the input terminals are disposed on one edge of the panel and the output terminals on another edge, in particular the opposite edge.

Preferably, the track portions constituting the direct connections or the crossed-over connections of a connection device are superposed on opposite faces of the printed circuit panel. This makes it possible, by drilling a single hole, to interrupt the two direct connections of an individual connection device.

According to an advantageous characteristic of the invention, the crossed-over connections are made by means of vias that are disposed laterally so as to be offset from the direct connections, and that are connected thereto. By destroying these two vias by drilling, it is possible to interrupt both branch connections of the individual connection device without running the risk of damaging adjacent tracks.

In order to protect the holes and the networks against dirtying and electrical breakdowns, the holes of the panel are plugged with a polymerizable resin. Both faces are also coated in a protective resin.

In a particular disposition of the invention, the individual connection devices are distributed over a plurality of stages of order n permutators disposed between the inputs and the outputs, a permutator of order n serving to implement one-to-one wiring between n inputs and n outputs.

Most advantageously, the printed circuit panel comprises three stages of permutators of order n, the inputs of the permutators of the first stage being directly connected electrically to the input terminals, the outputs of the permutators of the last stage being electrically connected directly to the output terminals, and between two successive stages, the outputs of each permutator of a stage of lower rank are electrically connected to respective ones of the inputs of each of the permutators of the stage of higher rank.

In addition, the permutators of order n may be disposed symmetrically about a longitudinal axis. They may also be disposed symmetrically about a transverse axis.

BRIEF DESCRIPTION OF THE DRAWINGS

Other advantages and characteristics of the invention appear on reading the following description made by way of example and with reference to the accompanying drawings, in which.

MORE DETAILED DESCRIPTION

Figure 1:
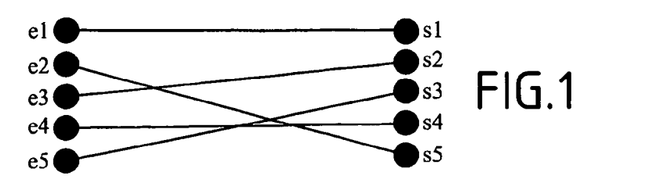
FIG. 1 is a diagram of the one-to-one wire connections to be made between the inputs and the outputs in a junction box.

FIG. 1 shows the one-to-one wire connections to be made between N inputs and N outputs of a junction box. In this figure, only five connections are shown for reasons of clarity, but the number of connections can be much greater than five, and is referred to below as being the number N.

The object of the invention is to provide a double-sided printed circuit panel, possibly a multilayer panel, that can be used for achieving all possible permutations, i.e. factorial N (N!) permutations.

The panel is subsequently personalized so as to implement only one selected one of the N! possible permutations for some particular application, in particular in aviation.

The cross-connections shown in FIG. 1 comprise five inputs referenced e1 to e5 and five outputs referenced s1 to s5, with the inputs e1, e2, e3, e4, and e5 being electrically connected to the outputs s1, s5, s2, s4, and s3, respectively.

In the invention, the outputs and the inputs of the junction box are interconnected using printed circuits that are configurable after the circuit has been physically manufactured: i.e. printed circuits are made having all possible combinations of interconnection, and then the circuit is individually personalized by being subsequently re-worked.

Figure 2:
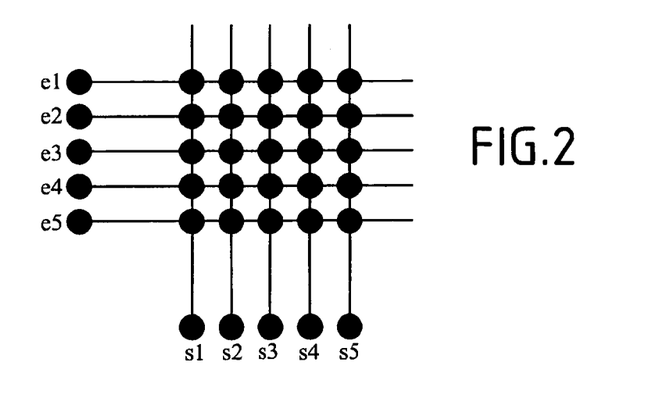
FIG. 2 shows a printed circuit panel of the matrix type as made and prior to being personalized.

FIG. 2 shows a printed circuit panel of the conventional matrix type, of order 5, serving to implement the particular cross-connection shown in FIG. 1, and also all other possible permutations between five input wires and five output wires. The five input wires to this printed circuit are connected to a first sheet of five parallel tracks printed on one of the faces of the panel, and the five output wires are connected to a second sheet of five parallel wires printed on the other face of the panel, the tracks of the second sheet being perpendicular to the tracks of the first sheet. Electrical connections between the five horizontal input tracks and the five vertical output tracks are made using vias, also known as "plated through holes", that are implemented at all of the intersections between the tracks of the two superposed sheets. Each input track is connected to all of the output tracks and each output track is connected to all of the input tracks. In order to personalize the printed circuit panel made in this way so as to obtain the wiring shown in FIG. 1, it suffices in a subsequent drilling operation to eliminate all of the vias that are superfluous, while conserving only those vias that are marked with a cross in FIG. 3.

The above description for a printed circuit panel having five inputs and five outputs is valid for a printed circuit having N inputs and N outputs.

However, the use of a matrix type printed circuit as shown in FIG. 2, also referred to as a circuit of the "crossbar" type, raises three problems:

the inputs are perpendicular to the outputs;
the number of holes to be drilled is large ($N^2-N$); and
the area of the circuit is large.

The object of the invention is to propose a system for making cross-connections by permutators using a printed circuit that enables all three of the above-mentioned problems to be solved.

A permutator is defined as being a function that allows incoming streams to be directed to outgoing streams in bijective manner.

These functions can be represented by so-called "permutation" matrices which are necessarily square matrices having special properties:

the matrix is a square matrix (as many inputs as there are outputs);
the matrix can comprise only 0s or 1s (a switching matrix); and
the sum of each of the rows or of each of the columns of the matrix is equal to 1 (the bijective property).

This is an example of a permutation matrix:

$$\begin{matrix} S1 \\ S2 \\ S3 \\ S4 \\ S5 \\ S6 \\ S7 \\ S8 \end{matrix} = \begin{matrix} 0 & 0 & 0 & 0 & 0 & 1 & 0 & 0 \\ 0 & 1 & 0 & 0 & 0 & 0 & 0 & 0 \\ 1 & 0 & 0 & 0 & 0 & 0 & 0 & 0 \\ 0 & 0 & 0 & 1 & 0 & 0 & 0 & 0 \\ 0 & 0 & 0 & 0 & 0 & 0 & 0 & 1 \\ 0 & 0 & 0 & 0 & 1 & 0 & 0 & 0 \\ 0 & 0 & 1 & 0 & 0 & 0 & 0 & 0 \\ 0 & 0 & 0 & 0 & 0 & 0 & 1 & 0 \end{matrix} \times \begin{matrix} E1 \\ E1 \\ E1 \\ E1 \\ E1 \\ E1 \\ E1 \\ E1 \end{matrix}$$

Technologically speaking, the term "permutator" is used herein to mean a connection device that enables permutations to be made between circuits.

Figure 9:
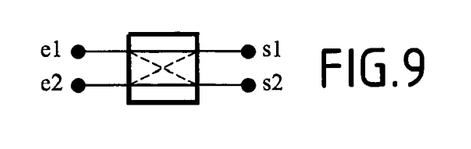
FIG. 9 is a diagram of a permutator with two inputs and two outputs.

The simplest permutator or individual connection device makes it possible to swap over two circuits (two inputs and two outputs). It is symbolized as shown in FIG. 9.

Depending on how the simplest, or order 2, permutator (written P(2)) is programmed, it is possible either to have direct connections (e1, s1) and (e2, s2) or else crossed-over connections (e1, s2) and (e2, s1).

Naturally, it is possible to envisage permutators of higher order, where the order of a permutator gives its number of input wires or output wires.

For order n, the number of possible permutations is n!.

This number is smaller than the number of combinations that are possible for a crossbar type matrix. The crossbar can implement $2**(n^2)$ different combinations for a profile having n inputs and n outputs. However it cannot be considered that the matrix is more powerful in topological terms since many of the combinations are not useful. By way of example, consideration can be given to the redundancies obtained by connecting input e1 to outputs s1 and s2 and connecting input e2 to the same outputs on a switching network of order 2, written R0. It is easy to show that such a network is equivalent to the following four networks:

R1 where e1 is connected to s1 and s2, and where e2 is connected to s1 only;

R2 where e1 is connected to s1 and s2, and where e2 is connected to s2 only;

R3 where e2 is connected to s1 and s2, and where e1 is connected to s1 only; and R4 where e2 is connected to s1 and s2, and where e1 is connected to s2 only.

Figure 10:
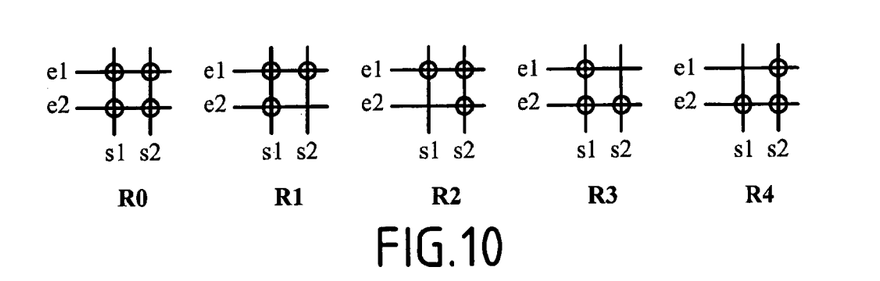
FIG. 10 shows equivalent networks.

These equivalent configurations are shown in FIG. 10.

Since permutations provide bijective connections only, redundancies must be avoided.

Figure 11:
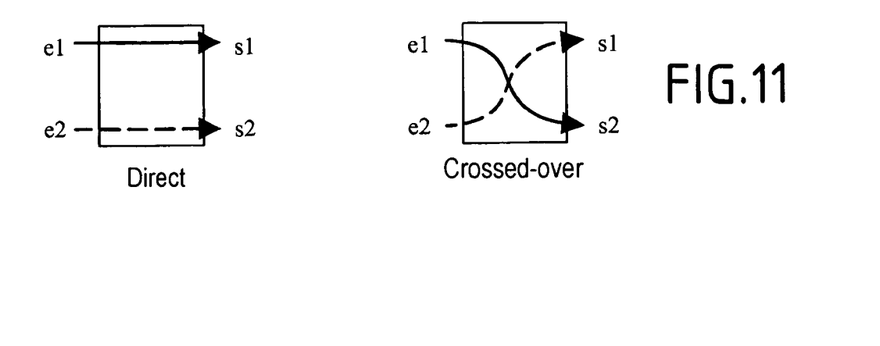
FIG. 11 shows direct and crossed-over connections in a permutator having two inputs and two outputs.

The only possibilities for order 2 are shown in FIG. 11.

These observations make it possible to obtain a significant saving in printed surface area.

Naturally, it is possible to make permutators for three, four, or more inputs. Nevertheless, it should not be forgotten that in order to program such permutators, there are n! possible permutations, i.e. six permutations for a permutator of order 3, 24 for a permutator of order 4, and 120 for a permutator of order 5.

The above permutation matrix can be defined as being a logical switch matrix. It can be associated with two operations comprising firstly putting circuits into parallel and secondly putting circuits in to series.

Putting circuits into parallel is an operation that is common in electricity, and it is represented directly in practice by a logic OR in the corresponding switch matrices.

By means of permutations, it is thus simple to implement electrical branch connections of quantity (or order) that is easily controlled.

Putting two permutations in series gives a combined permutator which, a priori, is of no advantage when using permutators of n inputs and n outputs.

The following question can be raised: is it possible to implement permutators of arbitrary order using permutators of lesser order?

It is indeed possible to make an order 3 permutator using permutators of order 2. This construction can be made in purely intuitive manner.

Figure 4:
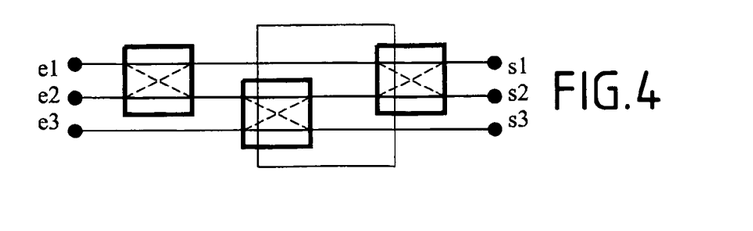
FIG. 4 shows a printed circuit having three inputs and three outputs and made with three permutators of the two input/two output type.

One example is shown in FIG. 4. It is possible to find other combinations using three or four permutators, but it is impossible to make a three-input permutator using only two two-input permutators.

In order to achieve the permutation of order 3 in exhaustive manner, it must be possible to implement at least six (3!) combinations. A permutator of order 2 can make two combinations (direct and crossed-over), with two permutators, a total of $2^2=4$ combinations are possible, so it is necessary to have at least three, since that gives a total of $2^3=8$ combinations. With such a scheme there will therefore be two redundant combinations, as follows:

(e1,e2,e3)=(s1,s2,s3) and (e1,e2,e3)=(s2,s1,s3)

A crossbar type matrix of order 3 would have $2^9=512$ possible combinations.

Figure 5:
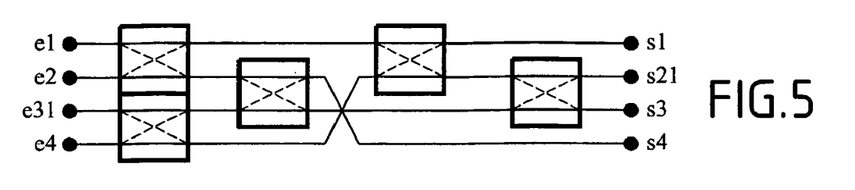
FIG. 5 shows a printed circuit having four inputs and four outputs made with five permutators each of the two input/two output type.

For order 4, which represents 24 combinations, at least two more permutators are required ($2^4=16$, but $2^5=32$). It is possible to implement the scheme shown in FIG. 5, which enables the 24 required combinations to be implemented using five permutators.

Other solutions also exist, for example it suffices to interchange the roles of two outputs (or inputs) of one of the permutators in order to obtain another scheme that satisfies the looked-for condition. The initial configuration for each of the two outputs is obtained by programming the corresponding permutator the other way.

Redundancies are still to be found in a permutator order 4 since 32 possible combinations exist but only 24 are useful.

Figure 3:
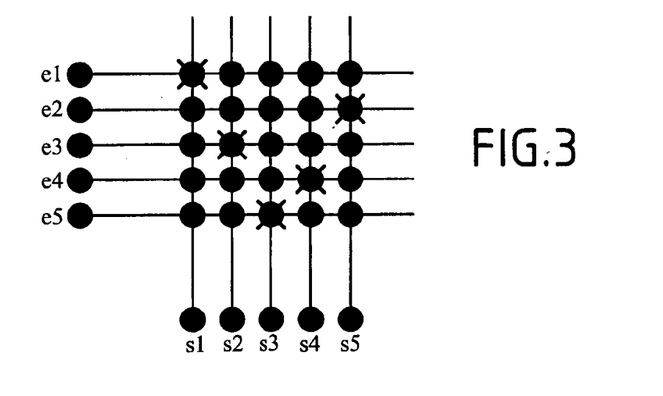
FIG. 3 shows the FIG. 2 panel after being personalized.
Figure 12:
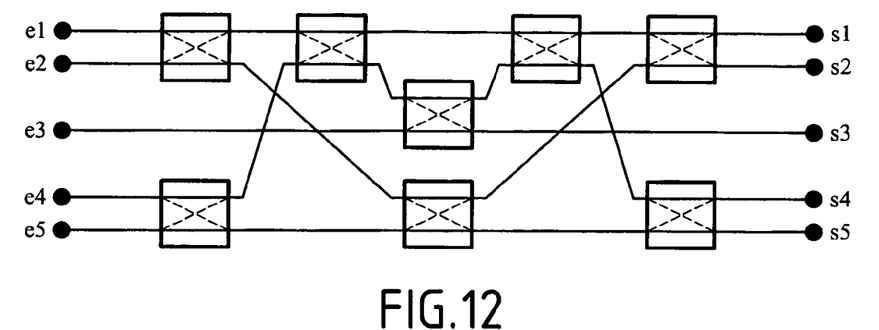
FIG. 12 shows an example of an order 5 permutator.

Continuing with this line of argument, it can be hoped that an optimum configuration can be found for certain orders. Thus, a permutator of order 5 represents 5! combinations, i.e. 120 combinations. Can this be achieved with seven order 2 permutators (giving 128 combinations)? It should be observed that for this particular value of 5!, the difference of only 8 combinations is very favorable. It is certain that this can be achieved with eight permutators of order 2, as shown in FIG. 12, to personalize the printed circuit having five inputs and five outputs, it suffices to eliminate the direct or the crossed-over connections in the eight permutators of order 2, whereas with a crossbar type circuit as shown in FIG. 3, it is necessary to eliminate 20 vias in order to achieve the same cross-connection effect.

Figure 13:
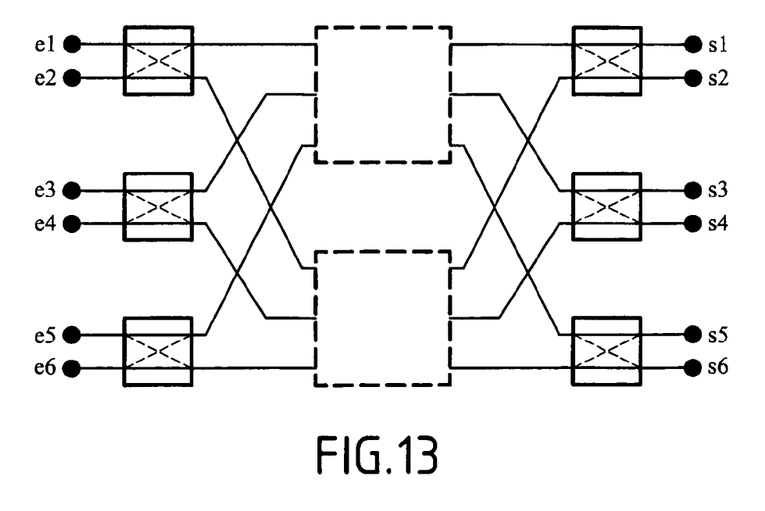
FIG. 13 shows an order 6 permutator having two axes of symmetry and three stages of permutators between its inputs and its outputs, the permutators of the middle stage being permutators of order 3.

An order 6 permutator is preferably made as shown in FIG. 13 using permutators of order 2 together with permutators of order 3. The six input lines penetrate into three permutators of order 2, shown in the left of FIG. 13. One output from each of these order 2 permutators penetrates into a top permutator of order 3, while the other output from each of these order 2 permutators penetrates into a bottom permutator of order 3. The three outputs from the top permutator of order 3 are connected to three permutators of order 2 situated on the right in FIG. 13 and the three outputs from the bottom permutator of order 3 are connected to the same permutators of order 2. The permutator of order 6 thus has a total of 12 permutators of order 2, which need to be personalized by interrupting the direct or the crossed-over connections, whereas with a printed circuit of the crossbar type having six inputs and six outputs, of the kind shown in FIG. 3, it would be necessary to eliminate 30 vias.

The permutator of order 6 when made in this way presents the particular feature of being symmetrical about a vertical mid-axis and about a horizontal mid-axis, providing the two permutators of order 3 are designed symmetrically about said horizontal mid-axis. This permutator of order 6 has three stages of permutators, with the middle stage being constituted by two permutators of order 3, while the input stage and the output stage have permutators of order 2 only.

The principle used for designing the permutator of order 6=2*3 is valid for any permutator of order N=a*b, where a is less than or equal to b.

For such a permutator of order N=a*b, the N input rows are connected to b permutators of order a disposed to the left of the printed circuit close to the input terminals. Each of these left-hand permutators of order a has one of its outputs penetrating into a respective middle permutator of order b, where the number of permutators of order b is a, and each permutator of order a on the left is connected to all of the middle permutators. Each middle permutator of order b has one output connected to each of the permutators of order a on the right of the printed circuit close to the outputs, which permutators are b in number.

Figure 14:
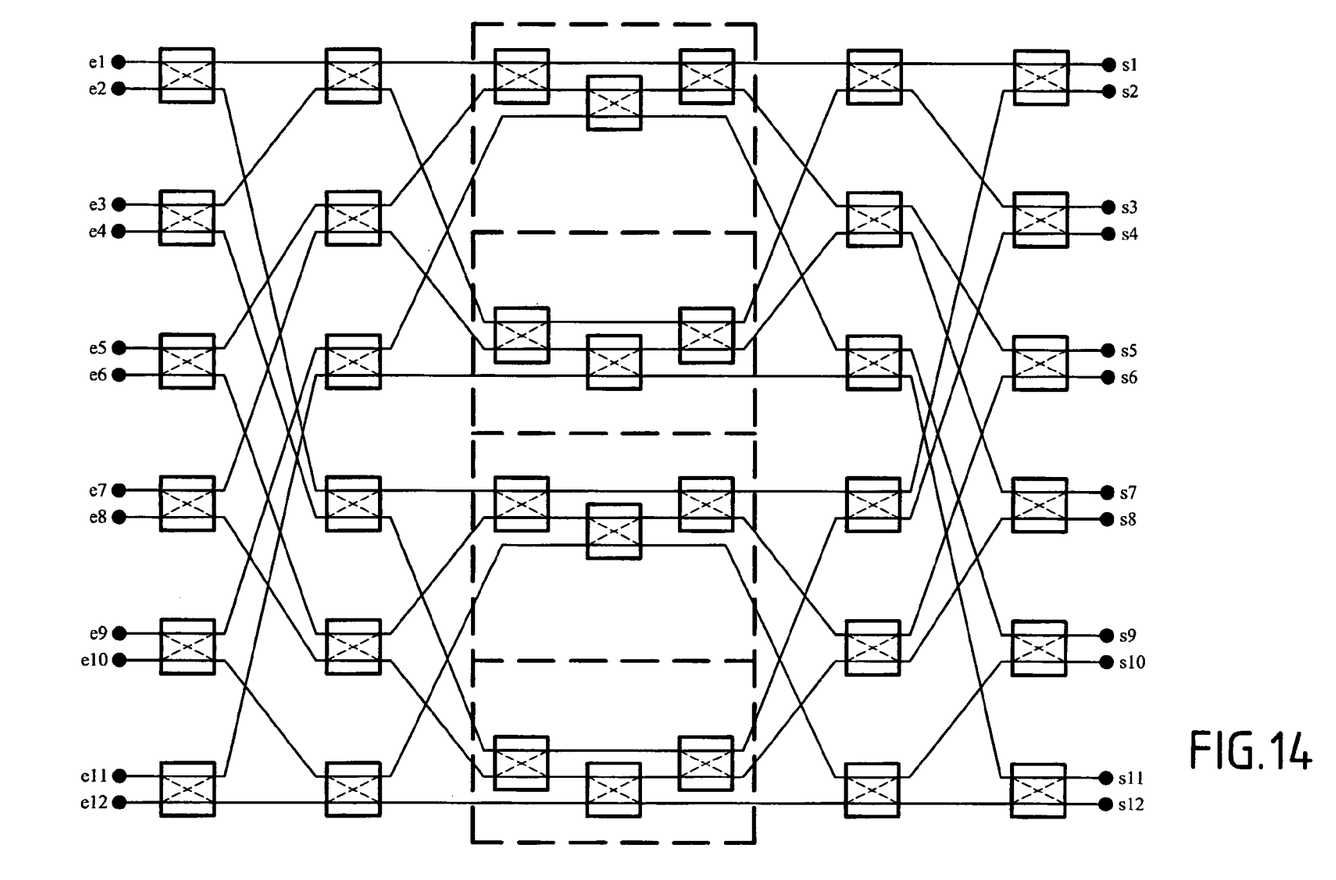
FIG. 14 shows a preferred example of an order 12 permutator.

When N=12 or 2*6, it can be seen that the permutator of order 12 can be made as shown in FIG. 14. This permutator of order 12 has 36 individual permutators of order 2 that need to be personalized, whereas a crossbar type connection with 12 inputs and 12 outputs would have 144 ($12^2$) vias, of which 132 would need to be eliminated.

If N=144=12×12, the printed circuit presents three columns of 12 permutators of order 12, i.e. 1296 (36×36) permutators of order 2, whereas with a logically identical crossbar type connection there would be 20,736 ($144^2$) vias of which 20,592 ($144^2$–144) would need to be eliminated. It is probable that a permutator of order 144 could be implemented with fewer than 1296 permutators of order 2, but it would then be difficult to obtain symmetries about a vertical mid-axis and a horizontal mid-axis, and both designing such a circuit for printing and verifying it would be much more difficult.

It is probably possible to make permutators of order 12 having fewer than 36 permutators, but there must be at least 29 since the minimum number of permutators needed, M, is calculated as follows:

$$M=\text{Log}_2(12!)=28.83$$

from which it can be deduced that M=29.

The above operations are advantageous. The area of copper needed for making a 12 by 12 matrix is 144 individual areas for making one junction box. If a permutator occupies an area of copper that is smaller than the area of a matrix junction multiplied by a weighting coefficient of 4.96=144/29, then it can be asserted that the area of copper needed for the permutations will be smaller than the area of copper needed for the matrices.

This value becomes even more advantageous when using ribbon cables. With 72 input wires and 72 output wires, cross-connecting using the method of the invention requires an area equivalent to 345 individual permutators instead of the 5184 individual connections of a crossbar type matrix. It can be seen that under such circumstances the basic ratio is 15, thus making it possible to hope that even if the area of a permutator is equivalent to three times the area of a matrix connection, the saving in area will still be large (a factor of 5).

The entire cross-connect circuit can be made using permutators on a printed circuit. Under such circumstances, the idea in each individual connection device is either to connect its inputs to its outputs directly or in a crossed-over configuration, or on the contrary to eliminate either the direct connections or the crossed-over connections that are pre-established in the circuit. It is this second solution of eliminating excess connections that is preferably used. This is because it is easy to arrange to eliminate two connections (either the direct connections or the crossed-over connections) simultaneously, merely by drilling. The technology then consists in implementing permutators that can be configured by interrupting the connections that are not be used.

Figure 6:
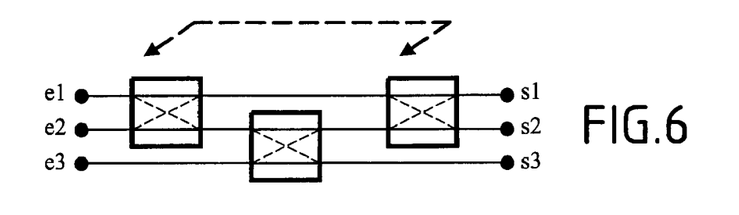
FIG. 6 shows a variant of the FIG. 4 printed circuit from which redundancies have been eliminated.

Permutators of order 2 are used. Even if redundancies are sometimes obtained, as is indeed the case, the permutators need to be associated. For example, for a permutator of order 3, the eight possibilities are reduced to six if it is possible to associate the first and last permutators of FIG. 4 in such a manner as to make it impossible for them both to be in the crossed-over configuration simultaneously. This is exactly what can be achieved using a multilayer printed circuit, as shown in FIG. 6.

This solution is entirely feasible (three programming holes instead of two per permutator, giving 3×2=6 combinations). Thus when permutator 2 is programmed to take up the crossed-over configuration, permutator 1 is simultaneously programmed to take up the direct configuration.

This possibility can be extended to more complex sets of permutators with some of them being associated in 2s, 3s, or more.

These remarks make it possible to find solutions that are more compact, probably with an increase in the number of layers of copper in the printed circuit, but above all they provide a new way of finding architectures for circuits that are difficult to implement intuitively above order 4.

Figure 8:
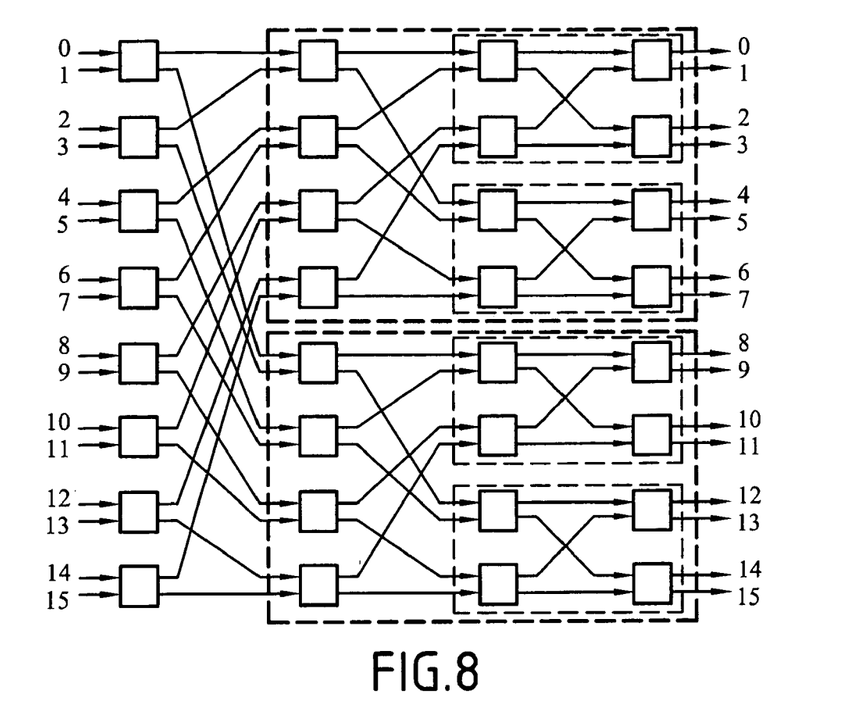
FIG. 8 shows the left-hand portion of a printed circuit having sixteen inputs and sixteen outputs and implemented in the form of a Benes network.

A special example of a printed circuit has a number of inputs and outputs that is a power of 2. Under such circumstances, it is possible to use a network of order 2 permutators similar to a Benes network of the kind used in telecommunications and corresponding to a recurring set of permutators of order 2r, for which the generic model comes from the Baseline network of order 2. FIG. 8 shows the structure of a Baseline network having 16 inputs.

Figure 7:
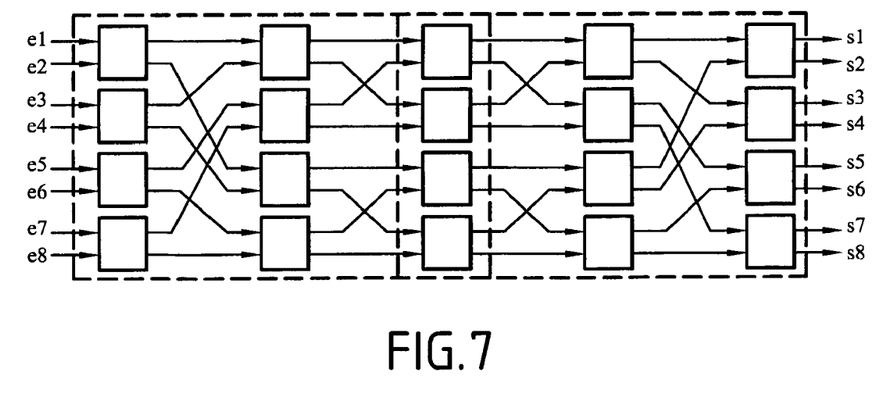
FIG. 7 shows a printed circuit having eight inputs and eight outputs implemented in the form of a Benes network.

It is possible to construct a re-arrangeable Benes type network by taking a Baseline network, making it symmetrical, and then reducing it. FIG. 7 shows a Benes network having eight inputs/outputs and comprising five stages of four switches. By replacing the switches of the network with permutators having two inputs and two outputs as described above, a printed circuit is obtained that is suitable for being personalized in order to produce one particular wiring configuration selected from factorial 8 permutations. The permutator thus has an input stage with four order 2 permutators, a middle stage with two order 4 permutators, and an output stage similar to the input stage, each permutator of order 4 comprising six permutators of order 2, even though five permutators of order 2 would suffice, but which are disposed symmetrically about both a horizontal axis and a vertical axis.

In a Benes network of order r, the number of stages is equal to 2r−1, and the number of switches per stage is $2^{(r-1)}$. The total number of permutators is $2^{(r-1)}(2r-1)$ or: $N/2(2\text{Log}_2(N)-1)$.

The improvement of this type of network is considerable compared with a matrix, and design is greatly simplified compared with a network that is optimized in terms of minimizing the number of permutators.

In the invention, it is possible to use this generic manner for making the matrix of permutators by replacing the switches in a Benes network with permutators having two inputs and two outputs and suitable for operating either with direct connections or with crossed-over connections.

Calculation shows that for 72 inputs/outputs that leads to 409 permutators, whereas an optimized design would require only 345. The saving in surface area of about 15% does not compensate the difficulty and the risks involved in designing the optimized circuit, particularly since when a circuit is more complex, then its connections occupy a greater area.

Benes type networks are implemented for numbers of inputs/outputs that are of the form $2^N$. It is relatively easy to reduce a Benes network for an arbitrary number of inputs/outputs by starting from the $2^N$ network that is immediately greater than or equal to said number. Thus, with 72 inputs/outputs, it is necessary to reduce a Benes network having 128 inputs/outputs. Under such circumstances, the formula for calculating the number of permutators needed continues to work very well (even though it is more approximate).

Assuming that a permutator made on a printed circuit occupies three times the area of an individual matrix junction, the saving in area for the circuit having 72 inputs/outputs is (72×72)/(409×3)>4.

Branch connections are obtained by combining on a given permutator selected for its convergence properties, both its direct connection circuits and its crossed-over connection circuits. It thus suffices to leave both types of connection in order to obtain a circuit interconnection. Since any cross-connection configuration is possible, any branch connection is also possible.

Figure 15A:
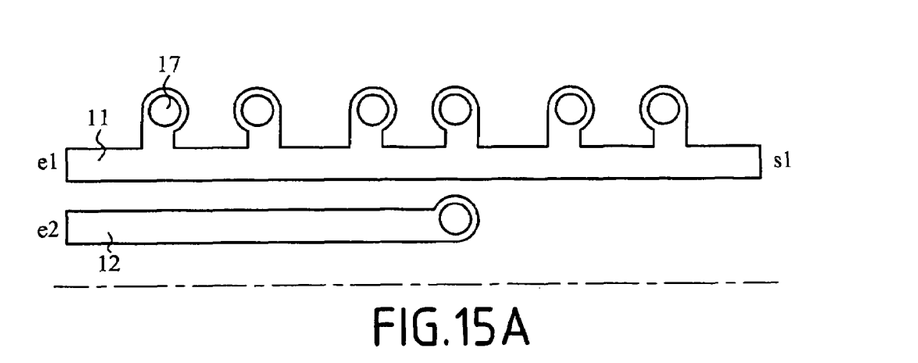
FIG. 15A shows the top face of a printed circuit having three order 2 permutators.
Figure 15B:
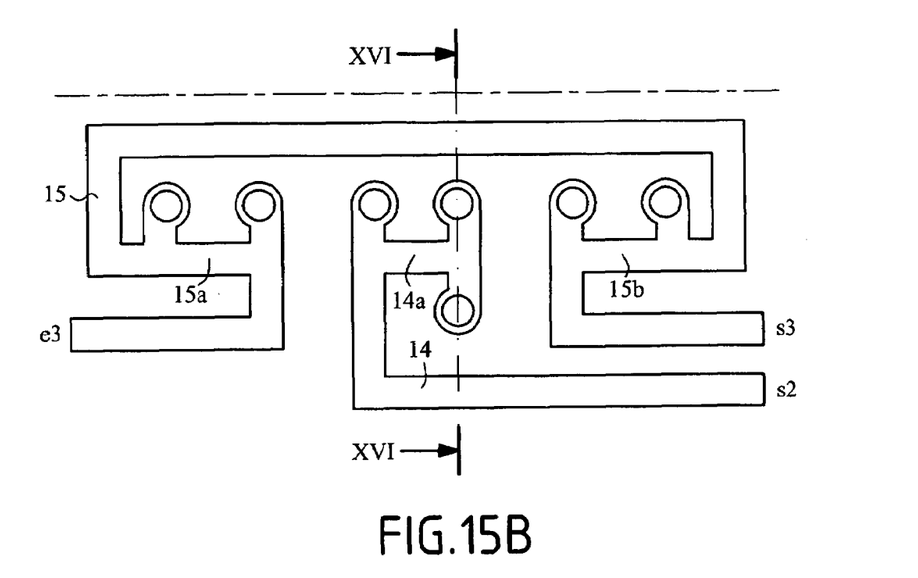
FIG. 15B shows the bottom face of the order 3 permutator of FIG. 15A.
Figure 16:
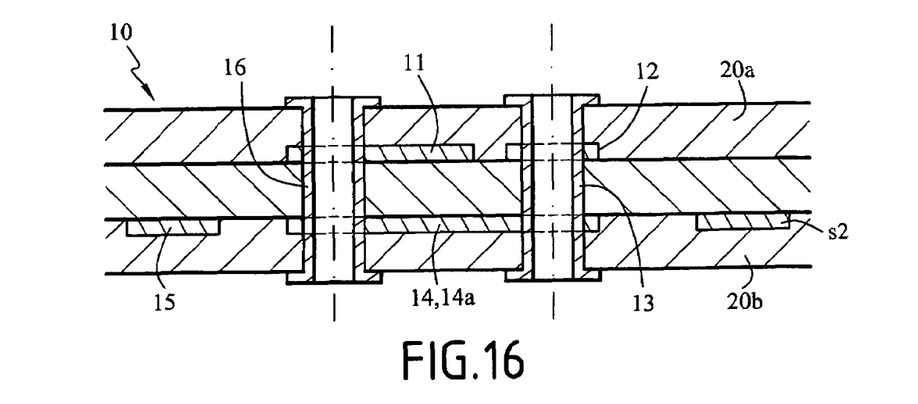
FIG. 16 is a section view on line XVI-XVI of FIGS. 15A and 15B showing a printed circuit of the invention.

FIGS. 15A, 15B, and 16 show an embodiment of a printed circuit comprising in particular an order 3 permutator having inputs e1, e2, and e3, and having outputs s1, s2, and s3. On the top face of the plate 10 constituting the printed circuit panel, there are two parallel tracks 11 and 12 that are substantially rectilinear. The end of the track 12 is connected by a via 13 to the end of a track 14 on the bottom face of the plate 10 and connected to the output s2. This bottom face also has thereon a track 15 connected to the input e3 and to the output s3. The track 15 presents two rectilinear portions 15a and 15b situated under the track 11. The track 14 also has a rectilinear portion 14a under the track 11 between the portions 15a and 15b. Beside these portions 15a, 15b, and 14a, there are vias 16 connected to the ends of these portions. These vias open out in the top face of the plate at locations 17 that are connected to the track 11 and they are formed by holes whose walls are metal-plated by conventional methods. The plate 10 with its top and bottom arrays of tracks is sandwiched between two layers of insulating material that stiffen the printed circuit and protect its tracks. To make the vias 13 and 16, holes are made through the layers 20a, 20b of the plate 10 and the walls of the holes are metal-plated. The printed circuit then has three individual connection devices. It will be readily be understood that in the state shown, the inputs e1, e2, e3 and the outputs s1, s2, s3 are short-circuited.

To personalize this permutator of order 3, holes are drilled in each individual connection device to interrupt either the direct connections or else the two associated vias 16. Thereafter, the holes are filled with insulating material. The via 13, which forms an integral portion of input track e1, is conserved throughout.

What is claimed is:

1. A printed circuit panel comprising N input terminals and N output terminals, the input terminals and the output terminals being interconnected by a network of tracks, the tracks being interconnected by a plurality of individual two input and two output connection devices disposed between adjacent portions of two tracks, wherein for each of said individual two input and two output connection devices, the two inputs are electrically connected to the two outputs firstly by two direct connections constituted by said track portions, and secondly by two crossed-over branch connections, such that each input terminal of the N input terminals of the panel is electrically connected to all of the N output terminals and each output terminal of the N output terminals of the panel is electrically connected to all of the N input terminals, and wherein the number and the disposition of said devices being selected in such a manner as to enable all possible wiring combinations to be implemented by interrupting in each individual connection device either the direct connections or the branch connections.

2. A panel according to claim 1, wherein the input terminals are disposed on one edge of the panel and the output terminals on another edge, in particular the opposite edge.

3. A panel according to claim 1, wherein the track portions constituting the direct connections or the crossed-over connections of a connection device are superposed on opposite faces of the printed circuit panel.

4. A panel according to claim 1, wherein the crossed-over connections are made by vias that are disposed laterally so as to be offset from the direct connections or the crossed-over connections, and that are connected thereto.

5. A panel according to claim 1, wherein, in each individual connection device, the direct connections or the branch connections are interrupted by drilling holes through said panel.

6. A panel according to claim 5, wherein the holes are plugged by an insulating resin.

7. A panel according to claim 1, wherein the individual connections devices are distributed over a plurality of stages of order n permutators disposed between the inputs and the outputs, a permutator of order n serving to implement one-to-one wiring between n inputs and n outputs.

8. A panel according to claim 7, comprising three stages of permutators of order n, the inputs of the permutators of the first stage being directly connected electrically to the input terminals, the outputs of the permutators of the last stage being electrically connected directly to the output terminals, and between two successive stages, the outputs of each permutator of a stage of lower rank are electrically connected to respective ones of the inputs of each of the permutators of the stage of higher rank.

9. A panel according to claim 8, wherein the permutators of order n are disposed symmetrically about a longitudinal axis.

10. A panel according to claim 9, wherein the permutators of order n are disposed symmetrically about a transverse axis.

11. A panel according to claim 1, wherein N is greater than 2.

12. A panel according to claim 11, wherein N is even, wherein a first plurality of N/2 individual two input and two output connection devices are connected to said N input terminals, a second plurality of N/2 individual two input and two output connection devices are connected to said N output terminals, and wherein said panel further comprises two permutators of order N/2 disposed between said first and second pluralities of N/2 individual two input and two output connection devices.

13. A panel according to claim 12, wherein said two permutators of order N/2 comprises a third plurality of individual two input and two output connection devices such that a total number for said panel of said individual two input and two output connection devices is less than $N^2$.

14. A panel according to claim 13, wherein N is 6 and said total number for said panel of said individual two input and two output connection devices is 12.

15. A panel according to claim 13, wherein N is 12 and said total number for said panel of said individual two input and two output connection devices is between 29 and 36, inclusive.

16. A panel according to claim 11, wherein said panel includes no terminal interconnected to said N input and output terminals, other than said N input and output terminals.

* * * * *